(12) United States Patent
Pezzani

(10) Patent No.: US 7,433,166 B1
(45) Date of Patent: Oct. 7, 2008

(54) CONSTANT CURRENT GENERATOR

(75) Inventor: Robert Pezzani, Vouvray (FR)

(73) Assignee: STMicroelectronics S.A., Gentilly (FR)

( * ) Notice: Subject to any disclaimer, the term of this patent is extended or adjusted under 35 U.S.C. 154(b) by 8 days.

(21) Appl. No.: 09/363,768

(22) Filed: Jul. 29, 1999

(30) Foreign Application Priority Data

Jul. 30, 1998 (FR) .................................. 98 09947

(51) Int. Cl.
*H02H 9/00* (2006.01)
*H02H 1/00* (2006.01)

(52) U.S. Cl. ........................................ 361/58; 361/93.9

(58) Field of Classification Search .................. 327/309, 327/312, 331, 438, 487; 323/232, 274, 265, 323/311, 312, 281; 361/58, 93.7, 93.9; 257/147, 257/165, 536, 603
See application file for complete search history.

(56) References Cited

U.S. PATENT DOCUMENTS

| | | | | | |
|---|---|---|---|---|---|
| 3,434,038 | A | * | 3/1969 | Vette ............................... 323/4 |
| 4,302,687 | A | * | 11/1981 | Yoshino et al. ............. 327/440 |
| 4,394,589 | A | * | 7/1983 | Pham et al. .................. 307/405 |
| 4,489,340 | A | * | 12/1984 | Ueda et al. .................. 257/365 |
| 4,682,198 | A | * | 7/1987 | Sakurada et al. ............. 257/157 |
| 5,504,449 | A | * | 4/1996 | Prentice ....................... 327/443 |
| 5,657,195 | A | | 8/1997 | Rault ............................. 361/86 |
| 5,663,860 | A | * | 9/1997 | Swonger ....................... 361/56 |
| 5,861,639 | A | * | 1/1999 | Bernier ........................ 257/157 |
| 5,883,500 | A | * | 3/1999 | Pezzani ....................... 323/217 |
| 6,188,267 | B1 | * | 2/2001 | Sanchez et al. ............. 327/438 |
| 6,252,451 | B1 | * | 6/2001 | Guitton et al. .............. 327/440 |
| 6,292,347 | B1 | * | 9/2001 | Bremond et al. ............ 361/253 |

FOREIGN PATENT DOCUMENTS

| | | | | |
|---|---|---|---|---|
| DE | 04303147 | A | * | 6/1994 |
| EP | 0 785 577 | | | 7/1997 |
| EP | 0798910 | A1 | * | 10/1997 |
| EP | 0978941 | A1 | * | 2/2000 |
| EP | 1158640 | A1 | * | 11/2001 |
| FR | 2770656 | | * | 7/1999 |
| FR | 2782859 | A1 | * | 3/2000 |
| JP | 03 60160 | | | 3/1991 |
| JP | 06 188410 | | | 7/1994 |
| JP | 07 78970 | | | 3/1995 |
| JP | 07 143733 | | | 6/1995 |

OTHER PUBLICATIONS

Ralph J. Smith, 1980, Electronics Circuits and Devices, p. 165.*
French Search Report from French Patent Application 98 09947, filed Jul. 30, 1998.

* cited by examiner

*Primary Examiner*—Ronald W Leja
(74) *Attorney, Agent, or Firm*—Lisa K. Jorgenson; James H. Morris; Wolf, Greenfield & Sacks, P.C.

(57) ABSTRACT

A constant current generator connected between first and second terminals includes a gate turn-off thyristor in series with a resistor; a current limiting component connected between the anode gate and the cathode gate of the thyristor; and a voltage reference connected between the cathode and the cathode gate of the thyristor.

27 Claims, 3 Drawing Sheets

CONSTANT CURRENT GENERATOR

BACKGROUND OF THE INVENTION

1. Field of the Invention

The present invention relates to current limiters or generators, and more specifically to current limiters likely to be inserted in power circuits to which high voltages, for example, above one hundred volts, can be applied.

2. Discussion of the Related Art

A current limiter is a component arranged in series in a circuit and intended for limiting the current in the circuit to a constant value. Thus, a current limiter is also often called a current generator.

Among current limiters or generators, one of the best known is formed of a depletion MOS transistor having its gate connected to its source. Such a component has the following disadvantages:

- it incorporates an intrinsic diode in anti-parallel and thus cannot withstand reverse voltages;
- it is technologically difficult to adjust the parameters which set the limiting current, especially the threshold voltage of the MOS transistor and the resistance of the preformed channel;
- the silicon surface required to make the component is relatively large.

Another simple circuit enabling realization of a current generator is shown in FIG. 1. This circuit is connected between terminals A and B, terminal A being normally positive with respect to terminal B, and includes the series connection of a transistor T and of a resistor R2. A resistor R1 is connected between the base and the collector of transistor T. A reference diode or avalanche diode Z is connected between the base of transistor T and terminal B. Emitter current Ie, which flows in resistor R2, is equal to (Vz−Vbe)/R2. If the values Vz, the voltage drop across the avalanche diode Z, and Vbe, the voltage drop between the base and emitter of transistor T, are substantially constant, then the current Ie is substantially constant.

This circuit however has the following disadvantages:

1) it is limited to the presence of low voltages, that is, the voltage between terminals A and B must not exceed a threshold value linked to the direct breakdown voltage of transistor T; this circuit operates all the better as the transistor has a high gain; this limits its breakdown voltage and increases breakdown risks;

2) in the case where the component is inserted in a circuit where the biasing between terminals A and B is likely to be reversed, a diode has to be arranged in series with the transistor to avoid destroying the transistor by high reverse currents; this adds to the component cost and increases its power consumption;

3) although current Ie is effectively substantially constant, as mentioned previously, current I coming out from terminal B is equal to the sum of current Ie and of the current flowing through resistor R1 and diode Z which, in operation, is in the on state. Current I depends on $V_{AB}$, the voltage between terminals A and B, and thus is not constant. The system thus has an overall characteristic $I_{AB}V_{AB}$, where $I_{AB}$ is the current between terminals A and B, substantially such as shown in FIG. 2, that is, the output current varies non-negligibly with the voltage thereacross.

This circuit is however widely used and preferred to depletion MOS-type transistors with interconnected gates and sources, because the limiting current can then be easily set by external components (Vz, R1 . . . ), whereas, in the case of the MOS transistor, the adjustment parameters are internal (channel resistance, threshold voltage . . . ).

SUMMARY OF THE INVENTION

The present invention aims at making a constant current generator which overcomes one or several of the disadvantages of known current limiters.

Another object of the present invention is to provide such a constant current generator which can be made in the form of a monolithic component, possibly associated with other power components.

To achieve these objects as well as others, the present invention provides a constant current generator connected between first and second terminals, including a thyristor of gate turn-off type in series with a resistor; a current limiting component connected between the anode gate and the cathode gate of the thyristor; and a voltage reference connected between the cathode and the cathode gate of the thyristor.

According to an embodiment of the present invention, the voltage reference is an avalanche diode having its cathode connected to the cathode of the gate turn-off thyristor.

According to an embodiment of the present invention, the current limiting element is a resistor.

According to an embodiment of the present invention, the current limiting element is a saturable resistor.

According to an embodiment of the present invention, the saturable resistor includes a well of a first conductivity type including first and second areas of the second conductivity type connected by a third area of the second conductivity type of low doping level, the first area of the second conductivity type being connected to a heavily-doped region of the first conductivity type connected to the substrate, the well being brought to a first voltage and the second area of the second conductivity type being connected to a second voltage.

The present invention aims at making a current generator formed in an area of a semiconductor substrate of a first conductivity type, including a first region of a second conductivity type formed on the rear surface side; a first well of the second conductivity type formed on the upper surface side; a second region of the first conductivity type formed in the first well; a second well of the second conductivity type formed on the upper surface side; a third region formed on the upper surface side in the second well; a strip of the second conductivity type formed on the upper surface side of the substrate. The vertical assembly of the first region, the substrate, the first well, and the last region forms a gate turn-off thyristor; the second well and the third region form an avalanche diode; a portion of the second well forms a resistor; and the strip forms a second resistor.

According to an embodiment of the present invention, the strip is a lightly-doped strip, whereby the second resistor is a pinch-effect saturable resistor.

The foregoing objects, features and advantages of the present invention, will be discussed in detail in the following non-limiting description of specific embodiments in connection with the accompanying drawings.

DETAILED DESCRIPTION

Figure 3:
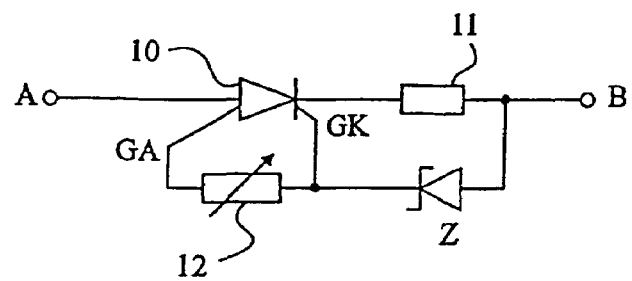
FIG. 3 shows a current limiter according to the present invention.

FIG. 3 shows the circuit of a current generator according to the present invention. It includes between terminals A and B a gate turn-off thyristor (GTO) 10 provided with an anode gate and a cathode gate. This GTO thyristor is connected by its anode to terminal A and by its cathode to the first terminal of a resistor 11, the second terminal of which is connected to terminal B. A current limiting element 12 is inserted between anode gate GA and cathode gate GK of thyristor 10. An avalanche diode Z is connected by its cathode to cathode gate GK of thyristor 10 and by its anode to terminal B.

Thus, when the device is in operation, the current in resistor 11 or cathode current of thyristor 10 is equal to (Vz-Vbe)/R, R being the value of resistor 11 and Vbe designating a voltage drop between the cathode gate and the thyristor cathode. Although it has been illustrated that the reference voltage function is ensured by an avalanche diode Z, it should be noted that this function could also be performed by a series of forward diodes or by an external power supply connected between cathode gate GK and output B.

Figure 4:
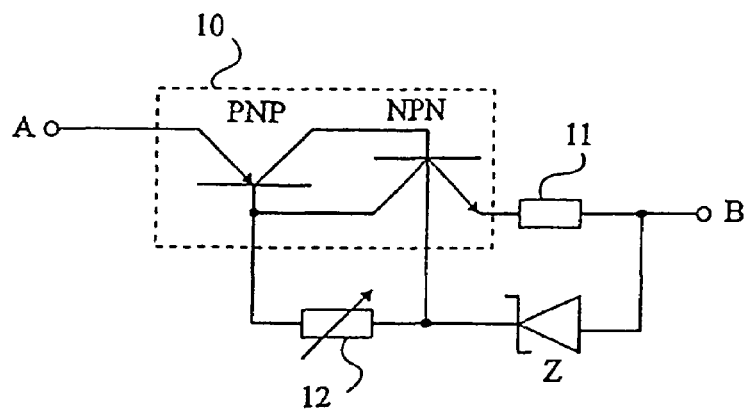
FIG. 4 shows an equivalent diagram of the current limiter of the present invention.

FIG. 4 shows the same diagram as that of FIG. 3 but in which gate turn-off thyristor 10 has been replaced by its equivalent diagram with two transistors. Indeed, it can be considered that a GTO thyristor 10 corresponds to the association of two PNP and NPN transistors, the emitter of the PNP transistor corresponding to anode A of the thyristor, the base of the PNP transistor being connected to the collector of the NPN transistor and corresponding to the anode gate of the thyristor, the collector of the PNP transistor being connected to the base of the NPN and corresponding to the cathode gate and the emitter of the NPN corresponding to the thyristor cathode.

It should first be noted that the present invention uses a thyristor in regulation mode. This is very unusual. Indeed, generally, thyristors and more specifically gate turn-off thyristors are used in switching mode, that is, they are controlled to be either in a blocked state or in a totally conductive state, the intermediary state only being a transient state.

Considering the two NPN and PNP transistors corresponding to the GTO thyristor, the product of the current gains (Hfe) of the two transistors is smaller than 1. When a voltage is applied between terminals A and B, a current tends to flow from terminal A, via the emitter/base junction of the PNP transistor, from resistor 12, from the base/emitter junction of the NPN transistor, and from resistor 11, to terminal B. The triggering is caused by the increase of the gains of the PNP and NPN transistors when the current increases. This current increase corresponds to a gate current. As soon as the product of the gains reaches 1, the triggering occurs. The system settles for a product greater than 1. It locks and the system remains conductive even if there is no more gate current. Conversely, the system tends to block again (become nonconducting) when the gain product which was greater than 1 tends to become smaller than 1.

Thus, the triggering is caused by simultaneously using the anode gate and the cathode gate through resistor 12, which enables concurrently controlling the PNP and NPN transistors. When the voltage across resistor 11 reaches value Vz (more substantially, 0.7 volt corresponding to the base/emitter voltage of the NPN transistor), the voltage becomes zero across the base-emitter and the system enters a regulation state. Indeed, if the voltage across the resistor exceeds Vz+0.7 V, a negative gate current comes out from the base of the NPN transistor. The thyristor being of gate turn-off type, its anode current, and thus the current through resistor 11, will tend to decrease. The voltage across resistor 11, of value R, thus becomes smaller than Vz+0.7 V and the cathode gate current becomes positive again. The system thus finds a balance or regulation point for:

$$R.I=Vz-0.7V$$

Thus, the entire structure regulates the current until it reaches a voltage limited by the voltage that can be withstood by its various elements, that is, GTO thyristor 10, and resistors 11 and 12. Indeed, the resistors can be high voltage resistors and the GTO thyristor is itself naturally a high voltage component. With relatively usual components, the current regulation can be effective while the voltage thereacross rises to values of several hundred volts, for example, 600 volts or more.

Further, these architectures withstand reverse voltages of the same amplitude as the maximum forward voltage. Indeed, the anode gate junction of a thyristor can withstand in reverse substantially the same value as the reverse voltage of the component, for example, 600 volts. This is due, referring to the equivalent diagram, to the architecture of the conventional PNP transistor of a thyristor. Indeed, this PNP transistor is symmetrical and thus withstands the same voltage in reverse or forward.

It should also be noted that a GTO thyristor, adapted for example for conducting currents on the order of one ampere, can be designed with a very high turn-on gain (turning-on by gate currents on the order of one tenth of a microampere). A particularly satisfactory regulation will thus be obtained.

Figure 1:
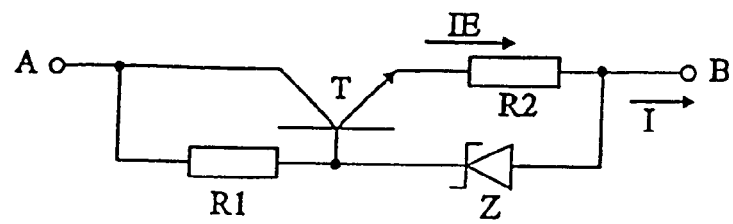
FIG. 1 shows a conventional transistor current limiter.
Figure 2:
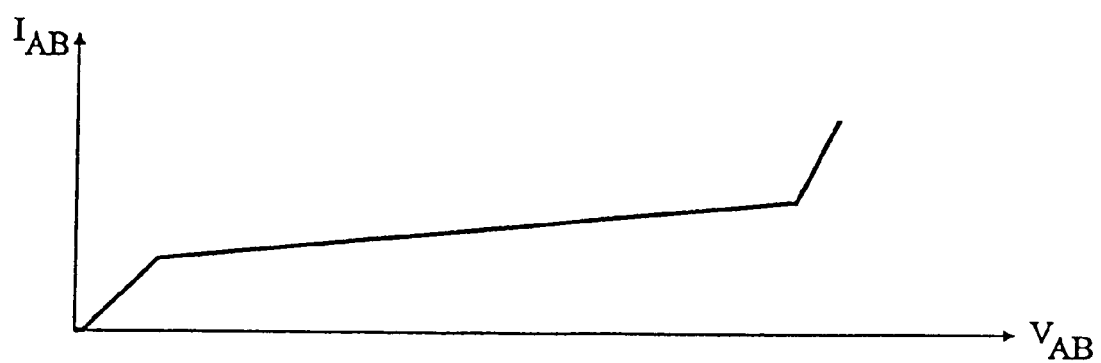
FIG. 2 shows the current/voltage curve of the current limiter of FIG. 1.

The circuit according to the present invention illustrated in FIG. 3 also has, over the conventional circuit of FIG. 1, the advantage of being able to withstand high voltages, as well forward as in reverse, which in particular avoids associating it with a series diode.

Figure 5:
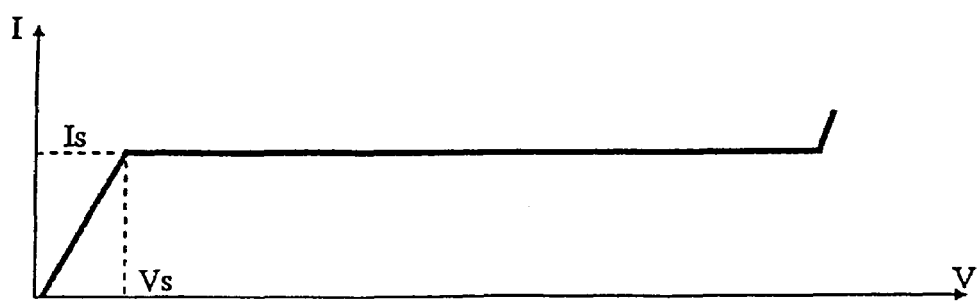
FIG. 5 shows the current/voltage characteristic of a non linear element used in the current limiter according to the present invention.

According to another aspect of the present invention, it is provided to use as a current limiting element 12, instead of a mere resistor, a current limiting element such as a saturable resistor. This component will have a voltage/current characteristic such as that shown in FIG. 5 having for example a value on the order of 75Ω at the voltage zero and a value limiting its current to an intensity on the order of one milliampere for high voltages rising for example to 600 volts.

Figure 6:
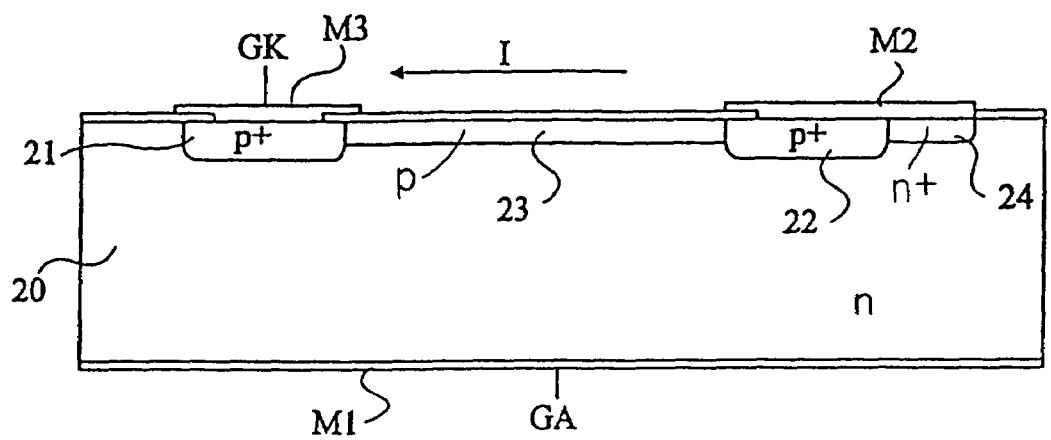
FIG. 6 shows an example of embodiment of a non linear element used in the current limiter of the present invention.

Such a variable resistor can for example be made in silicon in the way illustrated in FIG. 6. In an example of embodiment, the component is formed in an N-type substrate 20, the possibly overdoped rear surface of which is covered with a metallization M1 connected to terminal GA. On the upper surface side are formed two heavily-doped P-type regions 21 and 22 between which is formed a lightly-doped P-type region 23. Further, a heavily-doped N-type region 24 is formed adjacent to region 22.

The upper surfaces of regions 22 and 24 are connected by a metallization M2 which is not connected to any external terminal. The upper surface of region 21 is in contact with a metallization M3 connected to terminal GK. If a positive voltage is applied on terminal GA with respect to terminal GK, it may be assumed that this voltage exists in the entire substrate region 20 and in heavily-doped N-type region 24, that is, metallization M2 is also at the positive voltage of terminal GA. Thus, a current will flow from metallization M2 to metallization M3 in lightly-doped P-type region 23. If the voltage between terminals GA and GK increases, current I will increase until the limiting speed of the carriers is reached in layer 23. Then the electric field at the junction between substrate N and lightly-doped P-type region 23 will increase. The PN junction, being a reverse junction, will deplete and pinchoff the current in region 23, which compensates the voltage increase which tends to occur. The configuration of region 23 and an appropriate choice of its doping enable setting pinch-off current Is (see FIG. 5). Those skilled in the art will be able to optimize these values. As an example, a doping of region 23 of $10^{12}$ atoms/cm$^2$ redistributed down to a depth from 5 to 10 µm with a length of region 23 on the order of 100 µm enables withstanding more than 100 volts and limiting the current under 1 milliampere.

Of course, the realization of FIG. 6 is only one possible embodiment of a current limiter used instead of resistor 12 of FIGS. 3 and 4. This embodiment has been described in detail, because it can be used in a monolithic realization of the circuit of FIG. 3.

Figure 7:
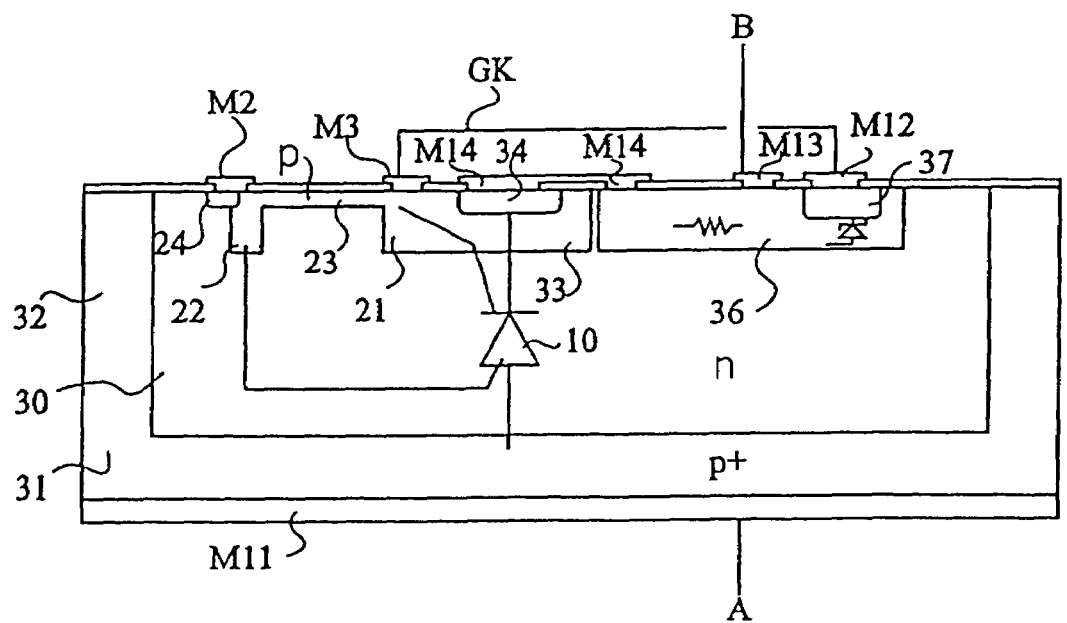
FIG. 7 shows an embodiment in monolithic form of the current generator of the present invention.

FIG. 7 shows a monolithic realization of the component of FIG. 3 in the case where current limiter 12 is of the type previously described in relation with FIG. 6.

The structure is formed of an N-type substrate 30, the lower surface of which supports a P-type layer 31. Preferably, the structure is surrounded with a P-type insulating wall 32. Portion 30 of the substrate surrounded with insulating wall 32 can form a portion of a larger component including other structures, for example, other power components, and possibly logic components. Thyristor 10 is made in vertical form. Its anode corresponds to P-region 31, its anode gate to N-type substrate 30, its cathode gate to a P well 33, and its cathode to an N-type region 34 formed in P well 33. Another P-type well 36 is formed on the upper surface side of substrate 30 and contains an N-type region 37. The junction between regions 36 and 37 corresponds to avalanche diode Z of FIG. 3. The structure illustrated in FIG. 6 is substantially reproduced in the upper left portion of FIG. 7. Similar regions are designated therein by same references, and region 21 is in fact formed of a portion of well 33.

The rear surface of this structure is covered with a metallization M11 which corresponds to the thyristor anode. Metallization M3, already described in relation with FIG. 6, is connected to a metallization M12 forming one piece with cathode region 37 of avalanche diode Z. Two metallizations M13 and M14, relatively distant from each other, are formed on well 36. Metallization M13 corresponds to terminal B which is connected to a first terminal of resistor 11 and metallization M14 corresponds to the second terminal of resistor 11 and extends to form the cathode metallization of the thyristor.

All elements constitutive of the diagram of FIGS. 3 and 4 have thus been made monolithically.

Of course, the present invention is likely to have various alterations, modifications, and improvements which will readily occur to those skilled in the art. In particular, various ways of making resistors in a monolithic circuit and various ways of generating reference voltages are known.

For example, if the architecture according to the present invention is desired to be made in monolithic form, values appropriate for in the considered technology will be used. The reference voltage will for example be chosen to be the reverse voltage of the gate/cathode junction. This results in values on the order of 5 to 10 volts according to the manufacturing line. Value R of resistor 11 will be chosen according to the desired limiting current based on formula R=(Vz−0.7)/I. Devices for which the limiting current ranges from 1 mA to 1 A can easily be made.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A constant current generator connected between first and second terminals, including:
    a thyristor of gate turn-off type;
    a current limiting component connected between an anode gate and a cathode gate of the thyristor; and
    a voltage reference operatively coupled to the cathode gate of the thyristor.

2. The current generator of claim 1, wherein the voltage reference is an avalanche diode having its cathode connected to the cathode gate of the gate turn-off thyristor.

3. The current generator of claim 1, wherein the current limiting component is a resistor.

4. The current generator of claim 1, wherein the current limiting component is a saturable resistor.

5. The current generator of claim 4, wherein the saturable resistor includes a well of a first conductivity type including first and second areas of a second conductivity type connected by a third area of the second conductivity type of low doping level, the first area of the second conductivity type being connected to a heavily-doped region of the first conductivity type connected to the substrate, the well being brought to a first voltage and the second area of the second conductivity type being connected to a second voltage.

6. The current generator of claim 1, formed in an area of a semiconductor substrate of a first conductivity type, including:
    a first region of a second conductivity type formed on the rear surface side;
    a first well of the second conductivity type formed on the upper surface side;
    a second region of the first conductivity type formed in the first well;
    a second well of the second conductivity type formed on the upper surface side;
    a third region formed on the upper surface side in the second well;
    a strip of the second conductivity type formed on the upper surface side of the substrate;
    whereby the vertical assembly of the first region, the substrate, the first well, and the second region forms a gate turn-off thyristor;
    the second well and the third region form an avalanche diode;
    a portion of the second well forms a resistor; and
    the strip forms a second resistor.

7. The current generator of claim 6, wherein the strip is a lightly-doped strip, whereby the second resistor is a pinch-effect saturable resistor.

8. A constant current generator having a first terminal and a second terminal, the constant current generator comprising:
    a gate turn-off thyristor having an anode, a cathode, an anode gate and a cathode gate, the anode of the gate turn-off thyristor being electrically coupled to the first terminal of the circuit;
    a first resistor electrically coupled between the anode gate and the cathode gate of the gate turn-off thyristor;

a second resistor electrically coupled between the cathode of the gate turn-off thyristor and the second terminal of the circuit; and a voltage reference electrically coupled to the cathode gate of the gate turn-off thyristor and to the first resistor.

9. The circuit of claim 8, wherein the first resistor is a saturable resistor.

10. The circuit of claim 8, wherein the voltage reference comprises a voltage supply.

11. The circuit of claim 8, wherein the first resistor and the second resistor are high voltage resistors.

12. The circuit of claim 8, wherein the voltage reference comprises a plurality of avalanche diodes.

13. The circuit of claim 8, wherein the voltage reference comprises an avalanche diode.

14. The circuit of claim 13, wherein the avalanche diode has a cathode electrically coupled to the cathode gate of the gate turn-off thyristor and an anode electrically coupled to the second resistor.

15. The circuit of claim 13, wherein the avalanche diode has an avalanche voltage that is approximately equal to a reverse voltage of a gate/cathode junction of the gate turn-off thyristor.

16. The circuit of claim 15, wherein a current provided by the second terminal is substantially independent of a voltage difference between the first and second terminals of the circuit.

17. The circuit of claim 16, wherein the current provided by the second terminal is approximately equal to a difference between an avalanche voltage of the avalanche diode and a voltage drop between the cathode-gate and the cathode of the gate turn-off thyristor divided by a resistance of the second resistor.

18. The circuit of claim 8, wherein the voltage reference comprises at least one forward biased diode.

19. The circuit of claim 8, wherein the gate turn-off thyristor operates in a regulation mode and not a switching mode.

20. The circuit of claim 8, wherein a voltage withstanding capability of the circuit in forward and reverse directions is approximately symmetric.

21. The circuit of claim 8, wherein the circuit is monolithically implemented in a single semiconductor substrate.

22. A method of providing a substantially constant current using a gate turn-off thyristor having an anode, a cathode, an anode gate and a cathode gate, comprising acts of:

applying a voltage difference between the anode and the cathode of the gate turn-off thyristor;

triggering the gate turn-off thyristor using the anode gate and the cathode gate of the gate turn-off thyristor; and regulating a current through the thyristor to a substantially constant value independent of a value of the voltage difference between the anode and the cathode of the gate turn-off thyristor by controlling a voltage at the anode gate and a voltage at the cathode gate.

23. The method of claim 22, wherein the act of regulating the current includes an act of:

using a first signal voltage related to a voltage at the cathode of the thyristor and which varies in dependence on the current through the thyristor to control the voltage at the cathode gate.

24. The method of claim 23, wherein a resistor is coupled to the cathode, and wherein the act of regulating the current further includes an act of:

deriving the first signal voltage by coupling a voltage reference to the cathode gate and the resistor.

25. The method of claim 24, wherein the act of regulating the current further includes an act of:

controlling an equilibrium point of the current through the thyristor based upon a value of the resistor.

26. The method of claim 25, wherein the act of regulating the current further includes an act of:

using a second signal derived from the first signal voltage to control the voltage at the anode gate.

27. The method of claim 24, wherein the act of regulating includes an act of operating the gate turn-off thyristor in a regulation mode and not in a switching mode.

* * * * *